United States Patent
Zhang et al.

(10) Patent No.: US 11,881,873 B1
(45) Date of Patent: Jan. 23, 2024

(54) HUFFMAN CORRECTION ENCODING METHOD AND SYSTEM, AND RELEVANT COMPONENTS

(71) Applicant: INSPUR SUZHOU INTELLIGENT TECHNOLOGY CO., LTD., Jiangsu (CN)

(72) Inventors: Yongxing Zhang, Jiangsu (CN); Yuhao Liu, Jiangsu (CN); Jiangbo Xu, Jiangsu (CN); Jiang Wang, Jiangsu (CN)

(73) Assignee: INSPUR SUZHOU INTELLIGENT TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 18/277,984

(22) PCT Filed: Dec. 30, 2021

(86) PCT No.: PCT/CN2021/142856
§ 371 (c)(1),
(2) Date: Aug. 19, 2023

(87) PCT Pub. No.: WO2023/015831
PCT Pub. Date: Feb. 16, 2023

(30) Foreign Application Priority Data

Aug. 11, 2021 (CN) .......................... 202110916338.1

(51) Int. Cl.
*H03M 13/00* (2006.01)
(52) U.S. Cl.
CPC ................. *H03M 13/6572* (2013.01)

(58) Field of Classification Search
None
See application file for complete search history.

(56) References Cited

U.S. PATENT DOCUMENTS

| | | | | |
|---|---|---|---|---|
| 6,771,824 B1* | 8/2004 | Chiu | .................. | H03M 7/42 382/233 |
| 8,593,308 B1* | 11/2013 | Biran | .................. | H03M 7/425 341/67 |
| 10,135,463 B1* | 11/2018 | Satpathy | ............. | H03M 7/6023 |
| 10,694,217 B2* | 6/2020 | Satpathy | ............... | H04N 19/13 |
| 10,756,758 B1* | 8/2020 | Abali | ................. | H03M 7/3077 |

(Continued)

FOREIGN PATENT DOCUMENTS

| | | |
|---|---|---|
| CN | 111093081 A | 5/2020 |
| CN | 111510156 A | 8/2020 |

(Continued)

*Primary Examiner* — Mujtaba M Chaudry
(74) *Attorney, Agent, or Firm* — IPro, PLLC

(57) ABSTRACT

The present disclosure discloses a method for Huffman correction and encoding, a system and relevant components, wherein the method includes: obtaining a target data block in a target file; constructing a Huffman tree by using the target data block; determining whether a depth of the Huffman tree exceeds a preset value; and when the depth of the Huffman tree does not exceed the preset value, by using the Huffman tree, generating a first code table and encoding the target data block; or when the depth of the Huffman tree exceeds the preset value, by using a standby code table, encoding the target data block; wherein the standby code table is a code table of an encoded data block in the target file.

20 Claims, 2 Drawing Sheets

(56) References Cited

U.S. PATENT DOCUMENTS

| | | | | |
|---|---|---|---|---|
| 11,817,887 B2 * | 11/2023 | Rigo | ................ | H03M 7/40 |
| 2015/0358031 A1 * | 12/2015 | Wu | ................ | H03M 7/4037 |
| | | | | 341/65 |
| 2020/0099958 A1 * | 3/2020 | Satpathy | ................ | H04N 19/13 |

FOREIGN PATENT DOCUMENTS

| | | | |
|---|---|---|---|
| CN | 113381768 A | | 9/2021 |
| CN | 113676187 A | | 11/2021 |
| CN | 113708772 A | | 11/2021 |
| EP | 1056210 A2 | | 11/2000 |

* cited by examiner

HUFFMAN CORRECTION ENCODING METHOD AND SYSTEM, AND RELEVANT COMPONENTS

CROSS REFERENCE TO RELEVANT APPLICATIONS

The present disclosure claims the priority of the Chinese patent application filed on Aug. 11, 2021 before the Chinese Patent Office with the application number of 202110916338.1 and the title of "HUFFMAN CORRECTION ENCODING METHOD AND SYSTEM, AND RELEVANT COMPONENTS", which is incorporated herein in its entirety by reference.

TECHNICAL FIELD

The present disclosure relates to the field of data compression and, more particularly, to a method for Huffman correction and encoding, a system and relevant components.

BACKGROUND

With the explosive data growth in the field of information science, servers bear a large pressure on how to store the mass data, and data compression has become an effective means of reducing the burden on the storage in servers and reducing the storage cost. The common data compression standards, such as Gzip, zip and zlib, compress and encapsulate the data blocks into data of a deflate format. Deflate is a lossless data compression algorithm, in which the lz77 algorithm is used to search for the repeating data in the data, and the Huffman encoding is used to characterize and encode the repeating data.

Because, in the Huffman encoding, the Huffman tree generated by ordering might have an excessively high depth and an excessively long code in the encoding, when the maximum depth prescribed by the deflate protocol is exceeded, the Huffman tree exceeding the maximum depth must be corrected. The currently commonly used excessively-long-code correcting methods are based on software algorithms, and are required to traverse and search the binary tree, to find the positions of the excessively long nodes and the grafting points of the excessively long nodes in the binary tree. Such a method may obtain a Huffman tree that ensures the optimum compression ratio. However, the traversing and searching is extremely time-consuming, and in particular cases the traversing cannot be performed in parallel. In extreme circumstances, the duration spent on correcting the Huffman tree might be multiple times the duration spent on constructing the Huffman tree.

SUMMARY

An embodiment of the present disclosure provides a method for Huffman correction and encoding, wherein the method includes:
  obtaining a target data block in a target file;
  constructing a Huffman tree by using the target data block;
  determining whether a depth of the Huffman tree exceeds a preset value; and
  when the depth of the Huffman tree does not exceed the preset value, by using the Huffman tree, generating a first code table and encoding the target data block; or
  when the depth of the Huffman tree exceeds the preset value, by using a standby code table, encoding the target data block;
  wherein the standby code table is a code table of an encoded data block in the target file.

In some embodiments, the method further includes:
  when the depth of the Huffman tree does not exceed the preset value, updating numerical values of the first code table to the standby code table.

In some embodiments, the step of constructing the Huffman tree by using the target data block includes:
  performing frequency-distribution statistics on the target data block, to obtain a frequency-distribution result; and
  according to the frequency-distribution result, constructing the Huffman tree.

In some embodiments, the preset value is 15.

In some embodiments, the encoded data block is the encoded data block adjacent to the target data block in the target file.

In some embodiments, the method for Huffman correction and encoding is implemented by using a hardware circuit.

Correspondingly, an embodiment of the present disclosure further discloses a system for Huffman correction and encoding, wherein the system includes:
  an obtaining module configured for obtaining a target data block in a target file;
  a constructing module configured for constructing a Huffman tree by using the target data block;
  a determining module configured for determining whether a depth of the Huffman tree exceeds a preset value; and
  an encoding module configured for, when the depth of the Huffman tree does not exceed the preset value, by using the Huffman tree, generating a first code table and encoding the target data block, and further configured for, when the depth of the Huffman tree exceeds the preset value, by using a standby code table, encoding the target data block;
  wherein the standby code table is a code table of an encoded data block in the target file.

Correspondingly, an embodiment of the present disclosure further discloses a computer device, wherein the computer device includes a memory and one or more processors, the memory stores a Huffman encoding program, and the Huffman encoding program, when executed by the one or more processors, causes the one or more processors to implement the steps of the method for Huffman correction and encoding according to any one of the above embodiments.

The processor is a hardware circuit.

Correspondingly, an embodiment of the present disclosure further discloses one or more non-volatile computer-readable storage mediums storing a computer-readable instruction, wherein the computer-readable instruction, when executed by one or more processors, causes the one or more processors to implement the steps of the method for Huffman correction and encoding according to any one of the above embodiments.

The details of one or more embodiments of the present disclosure are provided in the following drawings and description. The other characteristics and advantages of the present disclosure will become apparent from the description, the drawings and the claims.

BRIEF DESCRIPTION OF THE DRAWINGS

In order to more clearly illustrate the technical solutions of the embodiments of the present disclosure or the prior art, the figures that are required to describe the embodiments or the prior art will be briefly described below. Apparently, the figures that are described below are merely embodiments of the present disclosure, and a person skilled in the art may obtain other figures according to the provided figures without paying creative work.

DETAILED DESCRIPTION

The technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

The currently commonly used excessively-long-code correcting methods are based on software algorithms, and are required to traverse and search the binary tree, to find the positions of the excessively long nodes and the grafting points of the excessively long nodes in the binary tree. Such a method may obtain a Huffman tree that ensures the optimum compression ratio. However, the traversing and searching is extremely time-consuming, and in particular cases the traversing cannot be performed in parallel. In extreme circumstances, the duration spent on correcting the Huffman tree might be multiple times the duration spent on constructing the Huffman tree.

In the present disclosure, when the depth of the Huffman tree exceeds a preset value, the code table of an encoded data block in the target file is selected for encoding. Because the symbols and the probabilities of different data blocks in the same one target file have similarity, at this moment, the depth of the Huffman tree of the encoded data block does not exceed the preset value and the code table is smoothly generated for the encoding, and by using the standby code table a reliable encoding of the target data block may be completed, by this way, the effect of correcting an excessively long code may also be achieved, and the efficiency is obviously increased.

Figure 1:
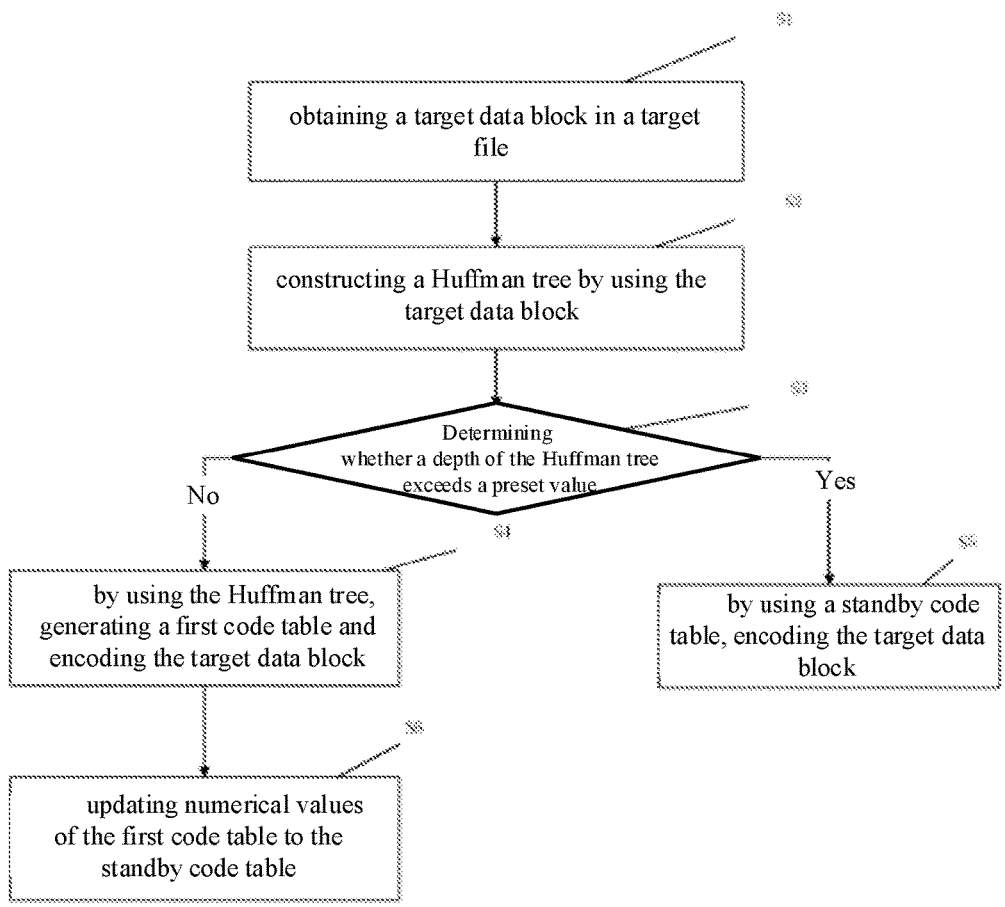
FIG. 1 is a flow chart of the steps of a method for Huffman correction and encoding according to one or more embodiments of the present disclosure.

An embodiment of the present disclosure discloses a method for Huffman correction and encoding. The subject of the implementation of the method may be a server or a terminal. Referring to FIG. 1, the method includes:

S1: obtaining a target data block in a target file.

It may be understood that, when any file is compressed, firstly the target file is segmented into a plurality of data blocks. Subsequently deflate encoding is performed to each of the data blocks. The process of the deflate encoding includes searching for repeating data in the data blocks by using a lz77 algorithm, and subsequently characterizing and encoding the repeating data by using a Huffman encoding module. The present embodiment is just about the characterization of the Huffman encoding module and correction and optimization of the part of encoding, wherein the target data block herein is the inputted content of the Huffman encoding module.

S2: constructing a Huffman tree by using the target data block.

The step S2 includes:

performing frequency-distribution statistics on the target data block, to obtain a frequency-distribution result; and according to the frequency-distribution result, constructing the Huffman tree.

S3: determining whether a depth of the Huffman tree exceeds a preset value.

It may be understood that, because the present embodiment is based on the deflate protocol to encode, and the deflate protocol requires that the depth of the Huffman tree does not exceed 15, therefore, the preset value is 15.

S4: if no, by using the Huffman tree, generating a first code table and encoding the target data block.

That the depth of the Huffman tree does not exceed the preset value is determined, and, based on the determination result, by using the Huffman tree, the first code table is generated and the target data block is encoded.

S5: if yes, by using a standby code table, encoding the target data block.

That the depth of the Huffman tree exceeds the preset value is determined, and, based on the determination result, by using the standby code table, the target data block is encoded.

The standby code table is a code table of an encoded data block in the target file.

In some embodiments, the encoded data block is the encoded data block adjacent to the target data block in the target file.

It may be understood that the data blocks in the same one target file have correlation therebetween, and if the data blocks are closer, their correlation is stronger. By collecting and counting up the relevant data, the Huffman data of the data blocks in the same one file may be analyzed. By using the mostly commonly used parameter for assessing the similarity, the peak signal to noise ratio (PSNR), as the assessment parameter, if the PSNR value is higher, the similarity is higher. Generally, if the PSNR is greater than 35, the data blocks are substantially the same. If the PSNR is greater than 25, the data blocks are highly consistent. If the PSNR is less than 20, the degrees of consistency of the data blocks are low. The calculation formula is as follows:

$$PSNR = 10 \times \log_{10}\left(\frac{(2^n - 1)^2}{MSE}\right).$$

wherein n is a bit number of the value of the sample, which may be 4 herein, and MSE refers to the mean squared error, whose calculation formula is as follows:

$$MSE = \frac{1}{N} * \sum_{i=0}^{N}(V_2(i) - V_1(i))^2.$$

Figure 2:
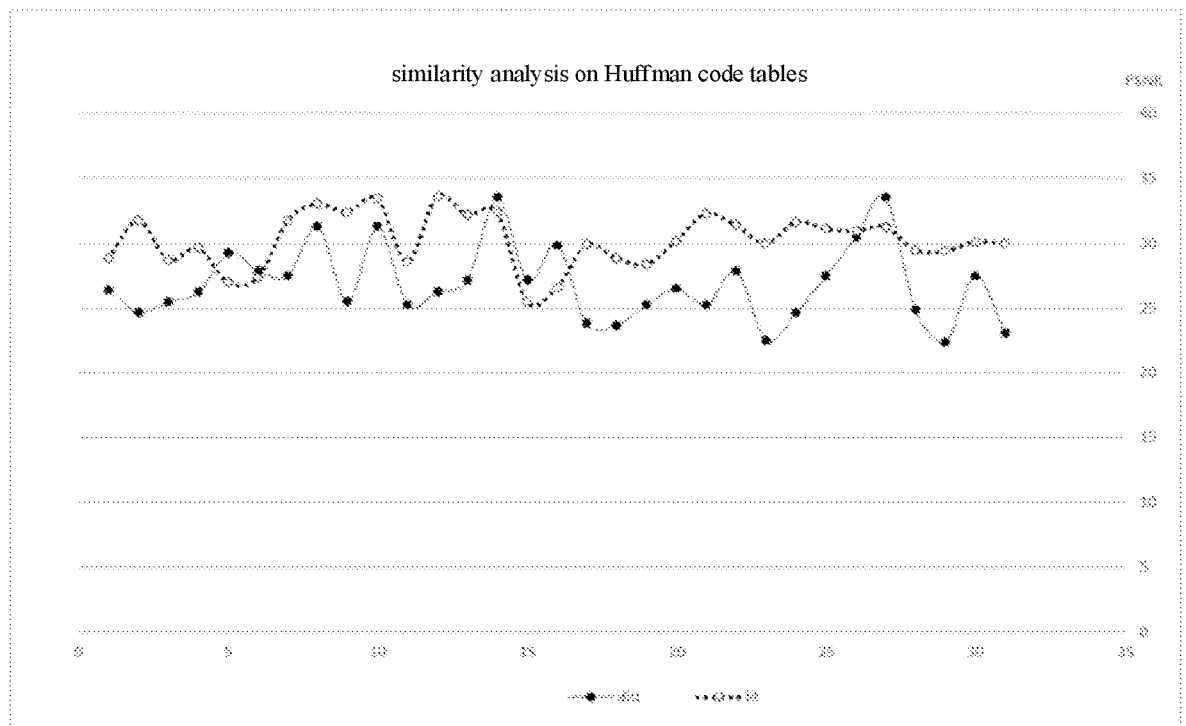
FIG. 2 is a curve diagram of the data distribution of the Huffman-code-table similarity between the data blocks according to one or more embodiments of the present disclosure.

FIG. 2 is a data-distribution curve of the Huffman-code-table similarity between the data blocks of a certain target file, wherein the horizontal coordinate is the serial numbers of different groups of the data blocks, and the longitudinal axis is the PSNR values of the groups of the data blocks. In the figure, the solid line is the PSNR of a Huffman tree of the type of literal tree, with the value of approximately 30, and the dotted line is the PSNR of a Huffman tree of the type of distance tree, with the value of approximately 25. Therefore, it may be considered that the Huffman code tables of the data blocks in the same one target file have a very high similarity, and when the depth of the Huffman tree of the target data block exceeds the preset value, the code table of the encoded data block may be utilized as the standby code table, to encode the target data block.

In order to verify the effectiveness of the present embodiment, a compression test may be performed to the files in two data-compression test sets, cantrbry and silesia. Table 1 is the result of the test of a software algorithm in the background art and an algorithm according to the present embodiment:

TABLE 1 comparison between test results

| file-name | src_size | soft_ratio | ratio(context) | delta_ratio |
|---|---|---|---|---|
| asyoulik_txt | 125179 | 2.0704 | 2.0674 | 0.0030 |
| bible_txt | 4047392 | 2.5092 | 2.4760 | 0.0332 |
| kennedy_xls | 1029744 | 3.5184 | 3.5161 | 0.0023 |
| plrabnl2_txt | 481861 | 1.9911 | 1.9878 | 0.0034 |
| ptt5 | 513216 | 6.5209 | 6.5196 | 0.0013 |
| world_192_txt | 2473400 | 2.0305 | 2.0267 | 0.0038 |
| dickens | 10192446 | 2.0682 | 2.0647 | 0.0035 |
| mozilla | 51220480 | 2.1495 | 2.1298 | 0.0197 |
| mr | 9970564 | 2.4542 | 2.4377 | 0.0165 |
| office | 6152192 | 1.6271 | 1.6133 | 0.0138 |
| osdb | 10085684 | 1.4700 | 1.4689 | 0.0011 |
| reymont | 6627202 | 2.4264 | 2.4062 | 0.0203 |
| samba | 21606400 | 2.8845 | 2.8727 | 0.0117 |
| sao | 7251944 | 1.2107 | 1.1992 | 0.0115 |
| xml | 5345280 | 4.2371 | 4.2322 | 0.0048 |
| webster | 41458703 | 2.5382 | 2.5346 | 0.0036 |
| x-ray | 8474240 | 1.2630 | 1.2567 | 0.0063 |
| Mean | | 2.5276 | 2.5182 | 0.0094 |

In Table 1, the first column file name and the second column src_size are the filenames and their file sizes in the test set respectively, the third column soft_ratio is the compression ratios obtained by compressing the files by using the software algorithm in the background art, the fourth column ratio (context) is the compression ratios obtained by compressing the files by using the method according to the present embodiment, the fifth column delta_ratio is the differences between the software algorithm and the present embodiment, and the last row mean is the average values of the above overall data. It may be seen from the data of the fifth column that the solution of the present embodiment and the software algorithm have a very low difference in the compression ratios, and the average difference is merely 0.0094. Therefore, the effect of compression according to the present embodiment is more ideal. The method for Huffman correction and encoding according to the present embodiment may be implemented by using a hardware circuit at a same time, and the efficiency of the encoding by the hardware circuit by using the present embodiment is far greater than the efficiency when the original software algorithm is used.

In some embodiments, when the depth of the Huffman tree does not exceed the preset value, the method further includes:

S6: updating numerical values of the first code table to the standby code table.

That the depth of the Huffman tree does not exceed the preset value is determined, and, based on the determination result, the numerical values of the first code table are updated to the standby code table.

It may be understood that, when the depth of the current Huffman tree does not exceed the preset value, its corresponding first code table serves as the encoding reference of the other data blocks in the target file. Therefore, the current first code table is updated to the standby code table, and subsequently the decoding of the new target data blocks may use the standby code table as the reference.

An embodiment of the present disclosure discloses a method for Huffman correction and encoding, wherein the method includes: obtaining a target data block in a target file; constructing a Huffman tree by using the target data block; determining whether a depth of the Huffman tree exceeds a preset value; and if no, by using the Huffman tree, generating a first code table and encoding the target data block; or if yes, by using a standby code table, encoding the target data block; wherein the standby code table is a code table of an encoded data block in the target file. In the present disclosure, when the depth of the Huffman tree exceeds a preset value, the code table of an encoded data block in the target file is selected for encoding. Because the symbols and the probabilities of different data blocks in the same one target file have similarity, at this moment, the depth of the Huffman tree of the encoded data block does not exceed the preset value and the code table is smoothly generated for the encoding, and by using the standby code table, a reliable encoding of the target data block may be completed. This process does not include traversing the Huffman tree constructed for the current target data block, the effect of correcting an excessively long code may also be achieved, and the efficiency is obviously increased.

Figure 3:
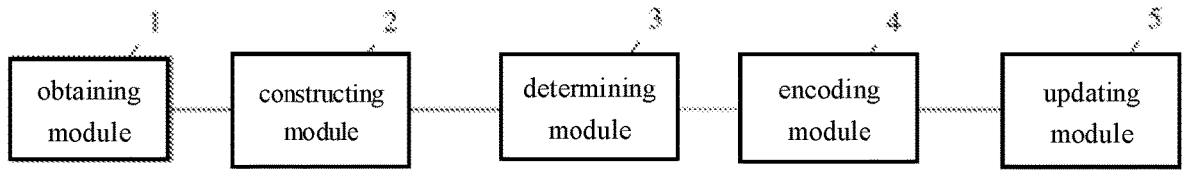
FIG. 3 is a structural distribution diagram of a system for Huffman correction and encoding according to one or more embodiments of the present disclosure.

Correspondingly, an embodiment of the present disclosure further discloses a system for Huffman correction and encoding. Referring to FIG. 3, the system includes:

an obtaining module 1 configured for obtaining a target data block in a target file;

a constructing module 2 configured for constructing a Huffman tree by using the target data block;

a determining module 3 configured for determining whether a depth of the Huffman tree exceeds a preset value; and an encoding module 4 configured for, when the depth of the Huffman tree does not exceed the preset value, by using the Huffman tree, generating a first code table and encoding the target data block, and further configured for, when the depth of the Huffman tree exceeds the preset value, by using a standby code table, encoding the target data block;

wherein the standby code table is a code table of an encoded data block in the target file.

In the embodiments of the present disclosure, when the depth of the Huffman tree exceeds a preset value, the code table of an encoded data block in the target file is selected for encoding. Because the symbols and the probabilities of different data blocks in the same one target file have similarity therebetween, at this point the depth of the Huffman tree of the encoded data block does not exceed the preset value and the code table is smoothly generated for the encoding, and by using the standby code table a reliable encoding of the target data block may be completed. That process does not include traversing the Huffman tree constructed for the current target data block, which may also reach the effect of correcting an excessively long code, and obviously increases the efficiency.

In some embodiments, the system for Huffman correction and encoding further includes:

an updating module 5 configured for, when the depth of the Huffman tree does not exceed the preset value, updating numerical values of the first code table to the standby code table.

In some embodiments, the constructing module is configured for:

performing frequency-distribution statistics on the target data block, to obtain a frequency-distribution result; and according to the frequency-distribution result, constructing the Huffman tree.

In some embodiments, the preset value is 15.

In some embodiments, the encoded data block is the encoded data block adjacent to the target data block in the target file.

Figure 4:
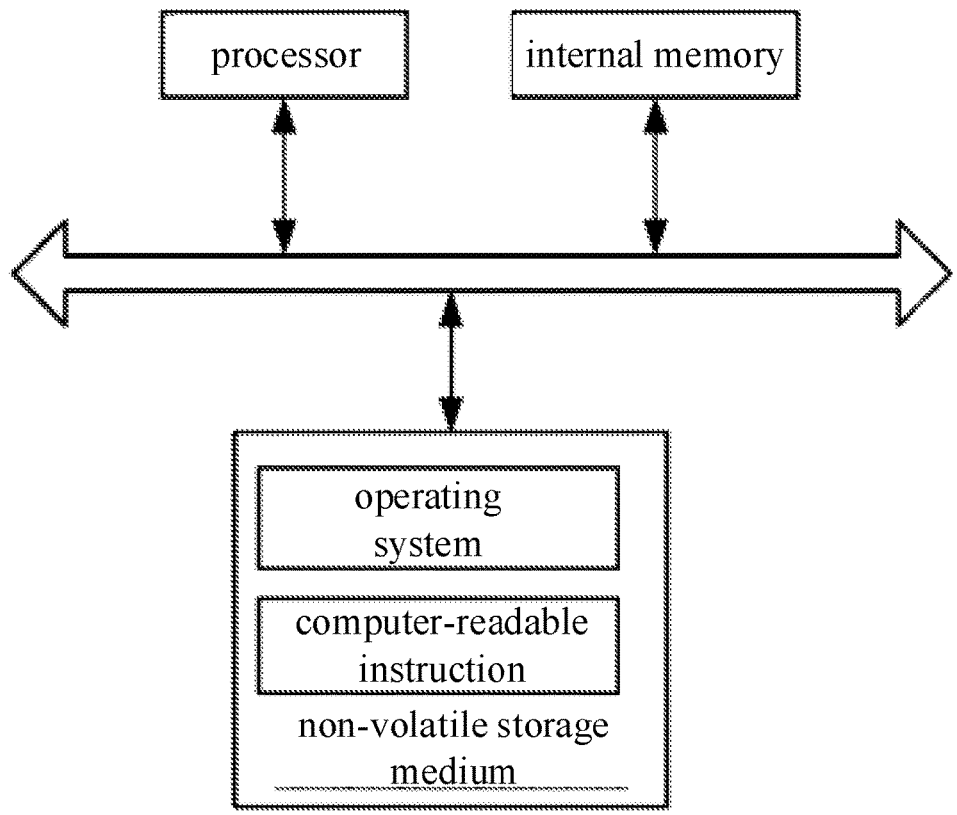
FIG. 4 is an internal structural diagram of a computer device according to one or more embodiments of the present disclosure.

In some embodiments, a computer device is provided, wherein the computer device may be a mobile smart platform or a robot, and its internal structural diagram may be as shown in FIG. 4. The computer device includes a processor and a memory that are connected by a system bus. The processor of the computer device is configured to provide the capacity of calculation and controlling. The memory of the computer device includes a non-volatile storage medium and an internal memory. The non-volatile storage medium stores an operating system and a computer-readable instruction. The internal memory provides the environment for the running of the operating system and the computer-readable instruction in the non-volatile storage medium. The computer-readable instruction, when executed by the processor, implements the method for Huffman correction and encoding.

A person skilled in the art may understand that the structure shown in FIG. 4 is merely a block diagram of a part of the structures relevant to the solutions of the present disclosure, and does not form a limitation on the computer device to which the solutions of the present disclosure are applied, and the computer device may include components more or fewer than those shown in the figure or a combination of some of the components, or has a different arrangement of the components.

Correspondingly, an embodiment of the present disclosure further discloses a computer device, wherein the computer device includes a memory and one or more processors, the memory stores a Huffman encoding program, and the Huffman encoding program, when executed by the one or more processors, causes the one or more processors to implement the steps of the method for Huffman correction and encoding according to any one of the above embodiments. In some embodiments, the processor is a hardware circuit.

Correspondingly, an embodiment of the present disclosure further discloses one or more non-volatile computer-readable storage mediums storing a computer-readable instruction, wherein the computer-readable instruction, when executed by one or more processors, implements the steps of the method for Huffman correction and encoding according to any one of the above embodiments.

The details of the method for Huffman correction and encoding according to the present embodiment may be referred to the relevant description in the above embodiments, and are not discussed further herein.

The computer device and the non-volatile computer-readable storage medium according to the present embodiment have the same technical effects as those of the method for Huffman correction and encoding according to the above embodiments, which are not discussed further herein.

Finally, it should also be noted that, in the present text, relation terms such as first and second are merely intended to distinguish one entity or operation from another entity or operation, and that does not necessarily require or imply that those entities or operations have therebetween any such actual relation or order. Furthermore, the terms "include", "comprise" or any variants thereof are intended to cover non-exclusive inclusions, so that processes, methods, articles or devices that include a series of elements do not only include those elements, but also include other elements that are not explicitly listed, or include the elements that are inherent to such processes, methods, articles or devices. Unless further limitation is set forth, an element defined by the wording "including a . . . " does not exclude additional same element in the process, method, article or device including the element.

The method and system for Huffman correction and encoding and relevant components according to the present disclosure have been described in detail above. The principle and the embodiments of the present disclosure are described herein with reference to the examples, and the description of the above embodiments is merely intended to facilitate to comprehend the method according to the present disclosure and its core concept. Moreover, for a person skilled in the art, according to the concept of the present disclosure, the embodiments and the range of application may be varied. In conclusion, the contents of the description should not be understood as limiting the present disclosure.

The invention claimed is:

1. A method for Huffman correction and encoding, comprising:
   obtaining a target data block in a target file;
   constructing a Huffman tree by using the target data block;
   determining whether a depth of the Huffman tree exceeds a preset value; and
   when the depth of the Huffman tree does not exceed the preset value, by using the Huffman tree, generating a first code table and encoding the target data block; or
   when the depth of the Huffman tree exceeds the preset value, by using a standby code table, encoding the target data block;
   wherein the standby code table is a code table of an encoded data block in the target file.

2. The method according to claim 1, wherein the method further comprises:
   when the depth of the Huffman tree does not exceed the preset value, updating numerical values of the first code table to the standby code table.

3. The method according to claim 1, wherein the step of constructing the Huffman tree by using the target data block comprises:
   performing frequency-distribution statistics on the target data block, to obtain a frequency-distribution result; and
   according to the frequency-distribution result, constructing the Huffman tree.

4. The method according to claim 1, wherein the preset value is 15.

5. The method according to claim 1, wherein the encoded data block is the encoded data block adjacent to the target data block in the target file.

6. The method according to claim 1, wherein the method for Huffman correction and encoding is implemented by using a hardware circuit.

7. The method according to claim 1, wherein a parameter of peak signal to noise ratio (PSNR) is used to assess similarities of data blocks, and the calculation formula of the PSNR is:

$$PSNR = 10 \times \log_{10}\left(\frac{(2^n - 1)^2}{MSE}\right)$$

wherein n is a bit number of a value of a sample, and MSE refers to a mean squared error.

8. The method according to claim 1, wherein before obtaining the target data block in the target file, the method further comprises:
segmenting the target file into a plurality of data blocks.

9. The method according to claim 1, wherein the target data block is inputted content of a Huffman encoding module.

10. A computer device, wherein the computer device comprises a memory and one or more processors, the memory stores a Huffman encoding program, and the Huffman encoding program, when executed by the one or more processors, causes the one or more processors to implement the steps of the method according to claim 1.

11. The computer device according to claim 10, wherein the processor is a hardware circuit.

12. One or more non-volatile computer-readable storage mediums storing a computer-readable instruction, wherein the computer-readable instruction, when executed by one or more processors, causes the one or more processors to implement the steps of the method according to claim 1.

13. The one or more non-volatile computer-readable storage mediums according to claim 12, wherein constructing the Huffman tree by using the target data block comprises:

performing frequency-distribution statistics on the target data block, to obtain a frequency-distribution result; and according to the frequency-distribution result, constructing the Huffman tree.

14. The one or more non-volatile computer-readable storage mediums according to claim 12, wherein the encoded data block is the encoded data block adjacent to the target data block in the target file.

15. The computer device according to claim 10, wherein the method further comprises:
when the depth of the Huffman tree does not exceed the preset value, updating numerical values of the first code table to the standby code table.

16. The computer device according to claim 10, wherein constructing the Huffman tree by using the target data block comprises:

performing frequency-distribution statistics on the target data block, to obtain a frequency-distribution result; and according to the frequency-distribution result, constructing the Huffman tree.

17. The one or more non-volatile computer-readable storage mediums according to claim 12, wherein the preset value is 15.

18. The computer device according to claim 10, wherein the preset value is 16.

19. The computer device according to claim 10, wherein the encoded data block is the encoded data block adjacent to the target data block in the target file.

20. The one or more non-volatile computer-readable storage mediums according to claim 12, wherein the method further comprises:
when the depth of the Huffman tree does not exceed the preset value, updating numerical values of the first code table to the standby code table.

* * * * *